US005729226A

United States Patent [19]
Betts et al.

[11] Patent Number: 5,729,226
[45] Date of Patent: Mar. 17, 1998

[54] ROB BIT COMPENSATION SYSTEM AND METHOD ASSOCIATED WITH A TRANSMITTER OR CODEC

[75] Inventors: William Lewis Betts, St. Petersburg; Keith Alan Souders, Tampa, both of Fla.

[73] Assignee: Paradyne Corporation, Largo, Fla.

[21] Appl. No.: 701,849

[22] Filed: Aug. 23, 1996

[51] Int. Cl.[6] ................................................ H03M 13/00
[52] U.S. Cl. ...................... 341/94; 370/522; 370/523; 379/93; 395/182.02
[58] Field of Search .................. 341/94; 370/522, 370/523; 379/93; 395/182.02, 182.04

[56] References Cited

U.S. PATENT DOCUMENTS

| 4,571,736 | 2/1986 | Agrawal et al. | 375/244 |
| 4,928,276 | 5/1990 | Blondeau, Jr. et al. | 370/523 |
| 5,282,197 | 1/1994 | Kreitzer | 370/522 |
| 5,506,956 | 4/1996 | Cohen | 395/182.04 |
| 5,577,105 | 11/1996 | Baum et al. | 379/93 |
| 5,577,196 | 11/1996 | Peer | 395/182.02 |

OTHER PUBLICATIONS

Method and Apparatus Compensating for Effects of Digital Loss Insertion In Signal Transmissions Between Modems, Application Serial No. 8/390,185; Filed Feb. 17, 1995.

*Primary Examiner*—Jeffrey A. Gaffin
*Assistant Examiner*—Jason L. W. Kost
*Attorney, Agent, or Firm*—Thomas, Kayden, Horstemeyer & Risley

[57] ABSTRACT

A rob bit compensation system improves the accuracy of digital signals transmitted to a digital network, such as a telephone network, that employs rob bit signaling (RBS) wherein the network periodically robs a bit for its own use. The rob bit compensation system can be employed within the transmit subsystem of a digital modem connected with the digital network that periodically robs a bit every nth frame, where n is, for example, 6, 12, or 24. The system may also be employed in association with the communications path within a coder/decoder (codec) that transmits data to the digital network. A feedback system advises the rob bit compensation system as to which frames of outgoing digital data are to have a bit robbed therefrom by the digital network. The feedback system causes a quantity to be mathematically combined with the digital data corresponding with each RBS frame in order to enhance accuracy of the RBS frames. As an example, one-half of an LSB may be added to the digital data corresponding with each RBS frame when the certain logic state is a mark (logical 1), or alternatively, one-half of an LSB may be subtracted from (i.e., add 2's complement) the digital data corresponding with the RBS frame when the certain logic state is a space (logical 0).

23 Claims, 7 Drawing Sheets

ROB BIT COMPENSATION SYSTEM AND METHOD ASSOCIATED WITH A TRANSMITTER OR CODEC

FIELD OF THE INVENTION

The present invention generally relates to data communications and, more particularly, to a rob bit compensation system and method for improving the accuracy of digital signals transmitted to a digital network that periodically robs a bit, for example but not limited to, a telephone network.

BACKGROUND OF THE INVENTION

A telephone network is often used as an interface between a digital modem and an analog modem. Generally, a digital modem is a device that communicates digital data by using digital signals that replicate analog waveforms. An analog modem is a device that communicates digital data by encoding the data on analog waveforms.

FIG. 1 shows a typical telephone network 99 for interconnecting a digital modem 101 and an analog modem 102. The digital modem 101 is usually interconnected with a digital network 113 via digital connections 112a, 112b. For instance, the digital modem 101 may be interconnected to a digital network 113 in the form of a public switch telephone network (PSTN) via a Local Exchange Carrier (LEC) subscriber loop. The digital network 113 may comprise, among other things, a T1 carrier system, a basic rate or primary rate Integrated Services Digital Network (ISDN), a fiber optic cable network, a coaxial cable network, a satellite network, or even a wireless digital communications network. Communications over the digital network 113 are conducted in accordance with a pulse code modulation (PCM) scheme. Channel capacity through these digital facilities is typically between 56 and 64 kilobits per second (kb/s). Coding of the signals is also employed so that compression and a constant signal/distortion performance over a wide dynamic range is achieved for optimal transmission of voice signals.

A commonly used coding technique is a nonlinear mu-law coding. The linear amplitude L corresponding with each code word is encoded, or converted to, a mu-law code word by the following equation:

$$M = (L+33) * 2^{8-N}$$

where M is the mu-law magnitude (e.g., 4 bits), L is the linear amplitude (e.g., 14 bits), and N is the mu-law segment, or frame (e.g., 3 bits). The mu-law code word is decoded, or converted to, a linear code word as follows:

$$L = \{(2M+33)2^N - 33\}$$

The digital network 113 is in turn interconnected with another LEC subscriber loop that includes a coder/decoder (codec) 106. The codec 106 is interconnected with the digital network 113 via digital connections 114a, 114b. The codec 106 is often situated at a telephone company office or along a street near the analog modem subscriber in a subscriber loop carrier (SLC) device. The codec 106 provides an interface between the digital network 113 and an analog telephone connection 118, sometimes referred to as a copper loop. For communications in the direction from the digital network 113 to the analog modem 102, the codec 106 includes a mu-to-linear digital-to-analog converter (DAC) 109. The converter 109 converts nonlinear mu-law levels to a linear analog signal.

For communications in the direction from the analog modem 102 to the digital network 113, the codec 106 includes a linear-to-mu analog-to-digital (ADC) converter 107. The converter 107 converts the linear analog signal to nonlinear mu-law code words.

A hybrid 103 is in communication with the DAC and ADC via respective low pass filters (LPFs) 111, 105. The hybrid 103 serves to separate the bidirectional analog signals from the analog telephone connection 118 into unidirectional transmit and receive analog signals sent to and received from the ADC 107 and the DAC 109, respectively.

Furthermore, the analog modem 102 is connected to the analog telephone connection 118 and communicates analog signals therewith. Thus, communications occur between the digital modem 101 and the analog modem 102 by way of the digital network 113 and the codec 106.

A method known as rob bit signaling (RBS) is oftentimes utilized in the digital network 113 to communicate on-hook/off-hook status between the modems 101, 102 and the digital network 113. RBS forces the least significant bit (LSB) of every nth frame, where n is typically 6, 12, or 24, to a constant logic level, either logical 1 or 0. Unfortunately, RBS causes the block error rate of data transfers to increase and the peak error to increase from 0.5 LSB to 1.5 LSB, as is illustrated in FIG. 2.

More specifically, with reference to FIG. 2, logic states are encoded by a transmit subsystem associated with the digital modem 101 in accordance with the encode step function indicated at reference numeral 122. The possible maximum error e resulting from the encoding/decoding process for any given signal level is 0.5 LSB. Further, when an RBS frame occurs, the LSB is driven to a predetermined logical state, either a mark (logical 1) or a space (logical 0). Therefore, the logic states are decoded as indicated by step functions 123 and 124 for the mark and space, respectively, as shown FIG. 2. The possible maximum error in both the 1-RBS frame and the 0-RBS frame resulting from the encoding/decoding process is 3*e, or 1.5 LSB. Almost needless to say, modem performance is seriously degraded as a result of RBS.

Hence, there exists a need in the industry for systems and methods for coping with RBS and for increasing the speed of data transfers through the digital network that periodically robs a bit.

SUMMARY OF THE INVENTION

The invention provides for a rob bit compensation system and method for improving the accuracy of digital signals transmitted to a digital network, such as a telephone network, that periodically robs a bit. As a result of the inventive system and method, high speed data transfers through the digital network are realized.

In general, the invention can be employed within a digital modem or a coder/decoder (codec), each of which is interconnected with a digital network that periodically robs a bit every nth frame, where n is, for example but not limited to, 6, 12, or 24. The rob bit compensation system can be implemented in association with the transmit subsystem that is associated with the digital modem or in association with the communications path within a codec for transferring data to the digital network.

In the context of the transmit subsystem within a modem, the rob bit compensation system is employed as follows. The transmit subsystem is configured to receive digital data from the local data terminal equipment (DTE). The data is processed into linear digital data having successive frames using conventional techniques. A feedback system advises the rob bit compensation system as to which frames of outgoing digital data are to have a bit eventually robbed therefrom by the digital network. The feedback system causes a quantity to be mathematically combined with the digital data corresponding with each RBS frame in order to enhance accuracy of the RBS frames. As an example, one-half of an LSB may be added to the digital data corresponding with each RBS frame when the certain logic state is a space (logical 0), or alternatively, one-half of an LSB may be subtracted from (i.e., add 2's complement) the digital data corresponding with the RBS frame when the certain logic state is a mark (logical 1).

In the context of a codec, the rob bit compensation system is employed as follows. The codec is configured to convert an analog signal that is directed in a first direction (e.g., transmitted to the digital network) from a linear analog signal to mu-law nonlinear digital data and the mu-law digital data that is directed in a second direction (e.g., transmitted to an analog modem) that opposes the first direction from mu-law nonlinear digital data to a linear analog signal. The feedback system of the rob bit compensation system can be utilized to detect RBS frames. Furthermore, a quantity can be combined with each RBS frame using the rob bit compensation system in order to enhance accuracy of each RBS frame.

The invention can also be conceptualized as providing a method for improving the accuracy of digital data transmitted to a digital network that periodically robs a bit. The method can be broadly summarized as follows: receiving digital data from a data terminal; constructing linear digital data having frames from the data terminal data; anticipating a frame in the linear digital data having a rob bit; modifying the frame so that error associated with the frame resulting from the rob bit is reduced; and transmitting the frame to the digital network.

The invention has numerous advantages, a few of which are delineated hereafter, as merely examples, An advantage of the invention is that it increases the accuracy of data transmitted to a digital network that periodically robs a bit.

Another advantage of the invention is that data transfer rates through the digital network can be increased.

Another advantage of the invention is that it reduces the RBS induced peak error in a signal that is passed through a digital network that practices RBS from 1.5 LSB to 1.0 LSB.

Another advantage of the invention is that it can detect any number and frequency of RBS frames, even when the digital network includes a plurality of subnetworks, each of which robs its own bit.

Another advantage of the invention is that the data rate of modem communications can be increased from 28,800 b/s to 33,600 b/s.

Another advantage of the invention is that for modems operating at 33,600 bits per second (B/S), the invention reduces the block error rate from at least 0.03 to 0.003 and typically achieves a factor of 10× improvement.

Another advantage of the invention is that it is simple in design, easily implemented in existing digital modems and codecs, and is reliable in operation.

Another advantage of the invention is that it can be implemented with software, hardware, or a combination thereof. Preferably, the invention is implemented in software that is stored in memory and that configures and drives a conventional digital signal processor (DSP).

Other objects, features, and advantages of the present invention will become apparent to one with skill in the art upon examination of the following drawings and detailed description. It is intended that all such additional objects, features, and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating principles of the present invention. In the drawings, like reference numerals designate corresponding parts throughout the several views.

DETAILED DESCRIPTION OF THE PREFERRED EMBODIMENTS

Figure 1:
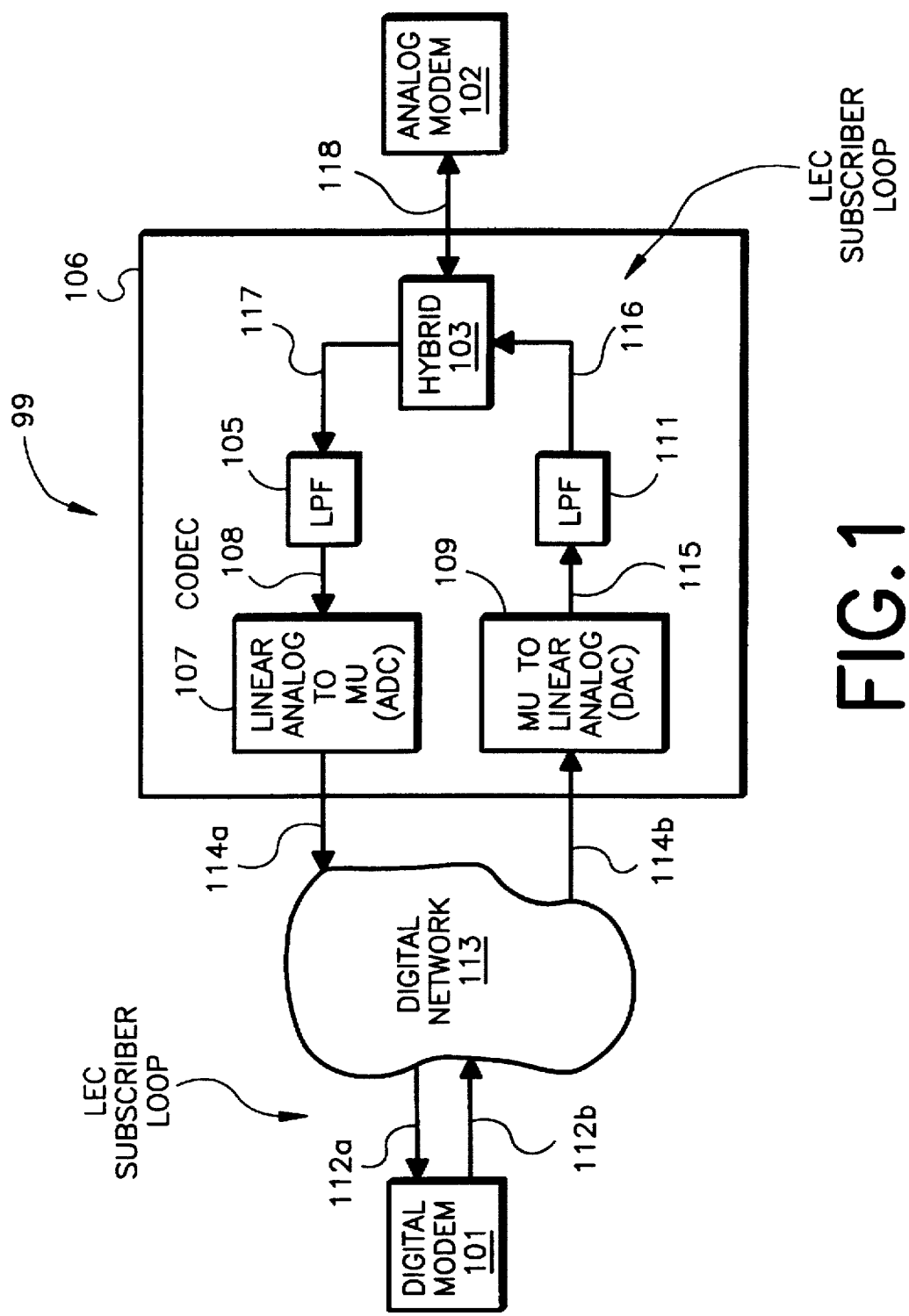
FIG. 1 is an electronic block diagram of a possible implementation for coupling together digital and analog modems over a digital network.

The invention is a rob bit compensation system 130, which will be described hereafter with reference to FIGS. 2 through 6. Generally, the rob bit compensation system 130 can be implemented in connection with a data path in either the digital modem 101 (FIG. 1) or the codec 106 (FIG. 1) in order to compensate for and minimize the distortion imposed upon data that is transmitted to a digital network 113 (FIG. 1) that periodically robs a bit from every nth frame, where n is typically 6, 12, or 24. When implemented in the digital modem 101, the rob bit compensation system 130 can be employed in connection with a transmit subsystem (FIG. 3). When implemented in the codec 106 (FIG. 4), the rob bit compensation system 130 can be employed in connection with the data path that passes data to the digital network 113.

Note the copending commonly assigned application entitled "Rob Bit Compensation System Associated With A Receiver Or Codec," filed the same day as the present application by the inventors herein and assigned serial no. (to be assigned) describes a rob bit compensation system that can be utilized in connection with a receive subsystem or codec for manipulating data that is received from the digital network, as opposed to data that is transmitted to the digital network.

A. Transmit Subsystem

FIG. 3 is an electronic block diagram of a possible implementation of a transmit subsystem 181 that can be situated within the digital modem 101 (FIG. 1) for receiving transmit data 183 from a local DTE and communicating it to the digital network 113 (FIG. 1). The transmit subsystem 181 can employ the rob bit compensation system 130 in order to minimize distortion that will ultimately be imposed upon the transmit data by the digital network 113 when the digital network 113 prospectively robs a bit(s).

Referring to FIG. 3, the transmit subsystem 181 communicates the transmit data 183 in the form of a binary bit stream from the local DTE to an encoder 189. The encoder 189 modulates and/or processes the transmit data 183. For this purpose, the encoder 189 may implement, for example, a serial-to-parallel converter, a filter, a scrambler, a trellis encoder, a modulator, etc. The encoder 189 can employ any suitable modulation and/or signal processing techniques, for example, those recommended by the conventional V.34 standard. When the encoder 189 employs V.34 modulation and signal processing, the data 126 that is output from the encoder 189 complies with the well known V.34 protocol so that the data stream corresponds with one of the fourteen possible V.34 speeds between 2400 b/s, and 33,600 b/s, inclusive.

The encoder 189 drives the linear digital signal 126 to the rob bit compensation system 130, which is configured to compensate for RBS frames, when RBS frames are detected, while passing frames unchanged in the case of non-RBS frames. The transmit subsystem 181 of FIG. 3 cannot directly detect RBS LSBs from the transmit signal because the RBS processing does not occur until a later time in the digital network 113. Accordingly, the transmit subsystem 181 utilizes a feedback system 210, 240 (FIGS. 5, 6) that employs a feedback for detecting RBS frames and for advising the compensation control 133 in the rob bit compensation system 130 of the same. The feedback system 210, 240 can be designed in many different manners. As mere examples, first and second embodiments of a feedback system 210, 240 are shown in respective FIGS. 5 and 6 and are described in detail hereinafter.

For purposes of simplicity at this point in the discussion, it will be assumed that the rob bit compensation system 130 receives feedback in the form of space and mark initialization signals 153a, 153b, respectively, from another component in the feedback system 210, 240, indicating when RBS frames occur. Based upon this information, the compensation control 133 of the rob bit compensation system 130 detects when compensation is appropriate and provides a compensation quantity to be added to each RBS frame when the RBS frame is present. In the preferred embodiment, during an RBS frame, the compensation addition mechanism 131 causes one-half of an LSB to be added to the linear digital code word 126 corresponding with an anticipated RBS frame when the RBS LSB is a space (logical 0), or alternatively, one-half of an LSB to be subtracted from (i.e., add 2's complement to) the linear digital code word 126 corresponding with an anticipated RBS frame when the RBS LSB is a mark (logical 1). The foregoing is set forth mathematically hereafter.

Non-RBS Frames

For frames of digital data that are not to have a rob bit, the rob bit compensation system 130 passes the digital data essentially unchanged to the linear-to-mu converter 197, which converts the linear code words to mu-law code words via the following equation:

$$M=(L+33)*2^{8-N}$$

RBS Frames Having A Mark LSB

For frames of digital data that are to have a rob bit in the form of a mark, the combination of the rob bit compensation system 130 and linear-to-mu converter 197 functions as follows. The linear amplitude L corresponding with each code word is converted to a mu-law code word by the following equation:

$$M=(L+32)*2^{8-N}$$

RBS Frames Having A Space LSB

For frames of digital data that are to have a rob bit in the form of a space, the combination of the rob bit compensation system 130 and linear-to-mu converter 197 functions as follows. The linear amplitude L corresponding with each code word is converted to a mu-law code word by the following equation:

$$M=(L+34)*2^{8-N}$$

Architecturally, the compensation addition mechanism 131 as shown in FIG. 3 includes successive adders 131a, 131b and is controlled by a compensation control 133. Generally, the compensation addition mechanism 131 receives successive 8-bit linear code words 126 from the encoder 189 and to each, it performs one of the following: (a) mathematically combines a zero with the code word 126 to convert the 8-bit code word 126 to a 9-bit code word 137 (i.e., effectively, forwards the code word 126 unchanged but with an additional bit); (b) adds 0.5 LSB to the code word 126 in order to produce a 9-bit code word 137; or (c) subtracts 0.5 LSB (i.e., adds 2's complement of 0.5 LSB, or −0.5 LSB) to the code word 126 in order to produce a 9-bit code word 137. In order to accomplish the aforementioned functionality, the adder 131a of the compensation addition mechanism 131 is configured to add either nothing or +0.5 LSB to each 8-bit code word 126 in order to generate a 9-bit code word 127, while similarly, the adder 131b is configured to add either nothing or −0.5 LSB to each 9-bit code word 127 in order to generate a 9-bit code word 137.

The compensation control 133 controls the adders 131a, 131b, as indicated by respective reference arrows 151, 161, to accomplish one of the aforementioned options. Furthermore, the compensation control 133 is configured to receive the space and mark initialization signals 153a, 153b, which are essentially a bit pattern that identifies which frames are RBS frames. Based upon the foregoing initialization signals 153a, 153b, the compensation control 133 detects when an RBS frame occurs and is configured to advise the compensation addition mechanism 131 when to combine a quantity (i.e., to effectively add or subtract an amount) with the RBS frame in order to enhance the accuracy of the RBS frame.

In architecture, the compensation control 133 of the rob bit compensation system 130 has mark RBS logic for identifying an RBS frame having an LSB that is a mark and space RBS logic for identifying an RBS frame having an LSB that is a space. The space and mark RBS logics generate respective control signals 151, 161 for the compensation addition mechanism 131. The signals 151, 161 are indicative of whether or not there is an RBS frame and whether the RBS frame either has a space LSB or a mark LSB, respectively.

The mark RBS logic includes a mark ring counter 146. The mark ring counter 146 is a shift register or other suitable mechanism. The mark ring counter 146 is configured to receive its own output at its data terminal (D). The mark ring counter 146 is preset so that all states match the mark initialization word 153b and is clocked by a clock signal 155 at a rate of preferably 8000 hz to correspond with the frame frequency rate of the incoming signal 126.

In the preferred embodiment, the mark ring counter 146 is an n state device, where n represents the frequency of the RBS frame. Typically, n is 6, 12, or 24. The mark ring counter 146 is shifted one state of n states every frame. In FIG. 3, the mark ring counter 146 shifts to the left so that the most significant bit (MSB) is output at reference arrow 148. When RBS compensation should be applied, the mark ring counter output (i.e., the most significant bit (MSB) of the stored word) exhibits a logical 1, and automatically tracks the RBS frames that have a mark LSB.

The space RBS logic identifies RBS frames having an LSB that exhibits a space. The space RBS logic includes a space ring counter 156. The space ring counter 156 is a shift register or other suitable mechanism. The space ring counter 156 is configured to receive its own output at its data terminal (D). The space ring counter 156 is preset so that all states match the space initialization (INIT) word 153a and is clocked by a clock signal 155 at a rate of preferably 8000 hz to correspond with the frame frequency rate of the incoming digital data 126.

In the preferred embodiment, just as with the mark ring counter 146, the space ring counter 156 is an n state device, where n represents the frequency of the RBS frame, and the space ring counter 156 is shifted one of n states every frame. In FIG. 3, the space ring counter 156 shifts to the left so that the MSB is output at reference arrow 158. When space RBS compensation should be applied, the space ring counter 156 output (i.e., the most significant bit (MSB) of the stored word) exhibits a logical 1 and automatically tracks the RBS frames that have a space LSB.

Figure 2:
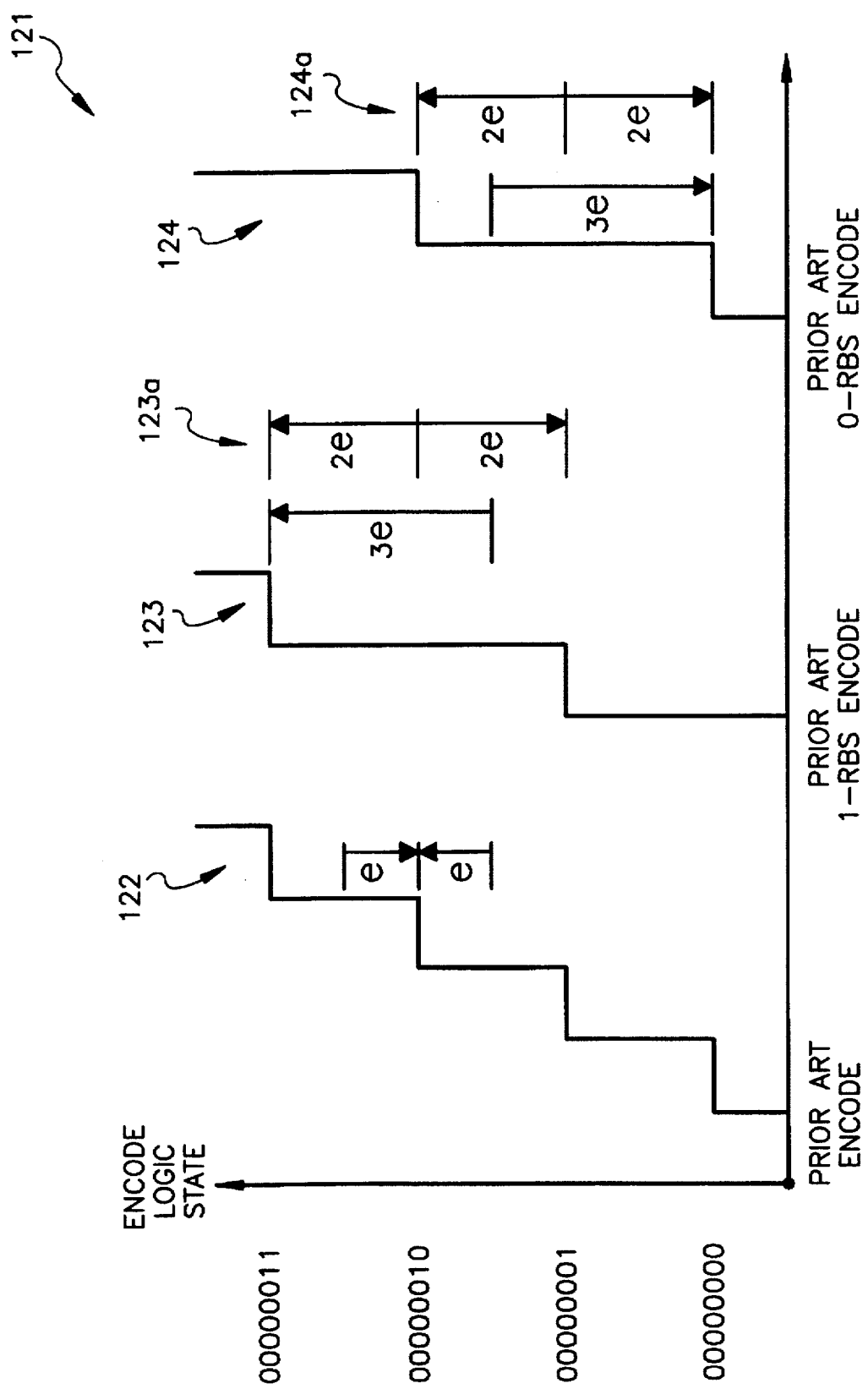
FIG. 2 is a graph comparing the effects of rob bit signaling (RBS) in a prior art decoding system and in a decoding system that employs the rob bit compensation system.
Figure 3:
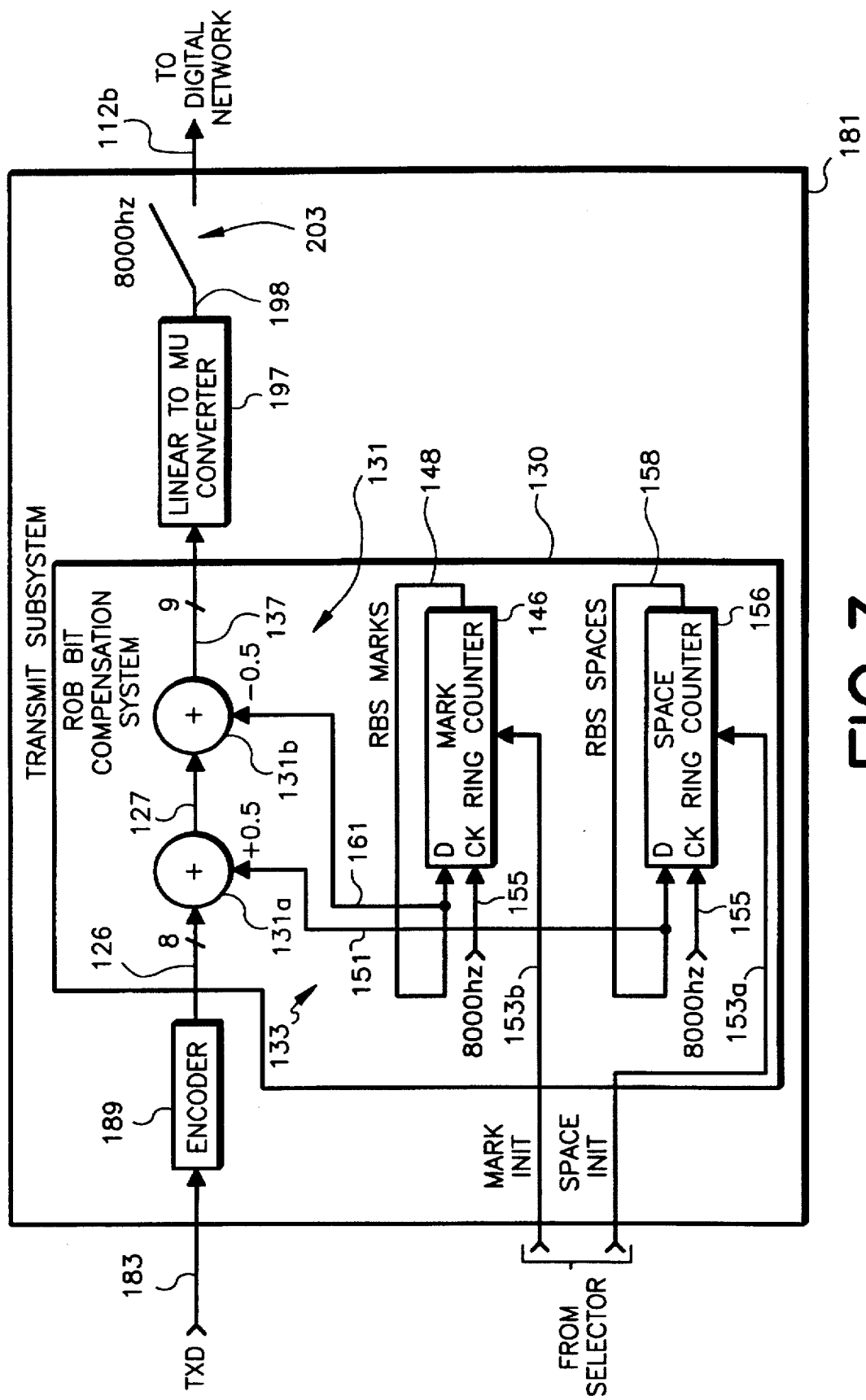
FIG. 3 is an electronic block diagram of a possible implementation of transmit subsystem that employs the rob bit compensation system of FIG. 3 within the digital modem of FIG. 1.

As a result of the rob bit compensation system 130 in FIG. 3, the transmit subsystem 181 can encode each RBS frame so that the maximum possible error in each RBS frame at a receiver is no greater than 1.0 LSB (i.e., 2*e), as is reflected at reference numerals 123a, 124a in FIG. 2. Recall that the possible maximum error in the RBS frame resulting from the encoding/decoding process of the prior art is 1.5 LSB (i.e., 3*e). Almost needless to say, modem performance is significantly improved by the invention during an RBS frame.

Further note that multiple RBS bits can occur as the signal passes through multiple switches, multiplexers, or subscriber loop carriers (SLC) associated with the digital network 113. The ring counters 146, 156 can monitor and compensate for RBS in multiple bit positions.

The linear-to-mu converter 197 converts each linear digital code word 137 to a mu-law nonlinear digital code word 198, which is output to the digital network 113 (FIG. 1) via a switch 203, which operates at preferably 8000 hz. The connection 112b is typically a T1 or ISDN connection, which operates with a frame switching frequency of 8000 hz. Moreover, the digital network 113 typically uses multiplexers that use mu-law encoded 64 kb/s PCM for transmission.

As a result of the rob bit compensation system 130 in FIG. 3, the transmit subsystem 181 can encode the RBS frame so that the error in the RBS frame at the receiver is no greater than 1.0 LSB.

Note that the elements of the transmit subsystem 181 of FIG. 3, as described previously, can be implemented in software, firmware, hardware, or a combination thereof. In the preferred embodiment, these elements, and particularly, the rob bit compensation system 130, is implemented in software that is stored in memory and that configures and drives a digital signal processor (DSP). Furthermore, the rob bit compensation system 130 can be stored on any computer-readable medium for use by or in connection with a computer-related system or method.

Example

In order to further clarify operation of the rob bit compensation system 130, an example with specific data is set forth hereafter. First, it is assumed that the rob bit compensation system 130 receives data 126 in the form of a series of 8-bit frames with bit patterns as set forth in Table A hereafter.

TABLE A

| FRAME # | DATA LSB |
|---------|----------|
| 1 | 0110000 1 |
| 2 | 0010111 0 |
| 3 | 1111001 1 |
| 4 | 1010010 1 |
| 5 | 0000100 0 |
| 6 | 0101011 1 |
| 1 | 1111000 1 |
| 2 | 1010000 0 |

Figure 5A:
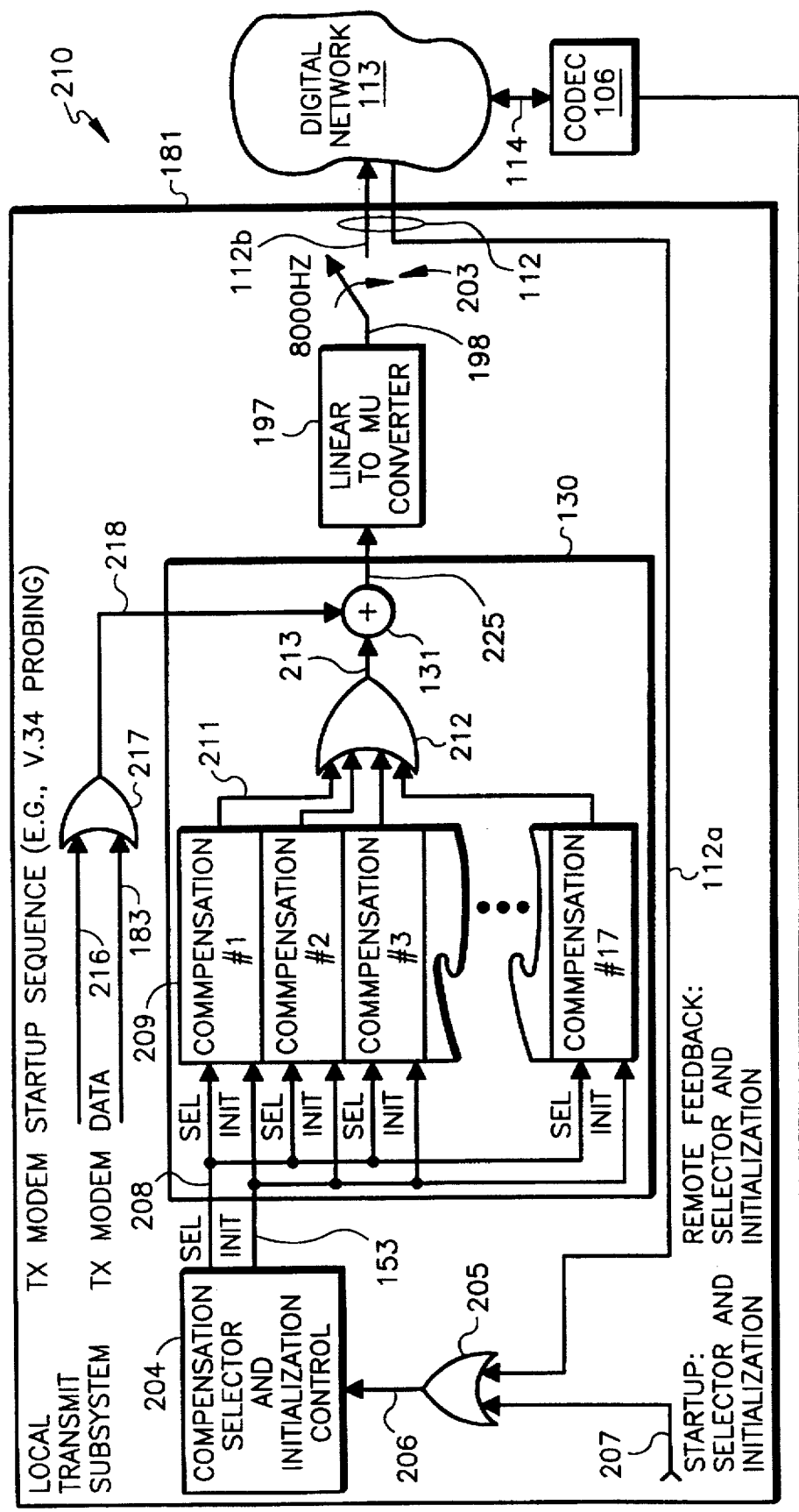
FIG. 5 is electronic block diagram of a possible first embodiment of a feedback system (cooperative) associated with the compensation selector of FIG. 5.
Figure 5B:
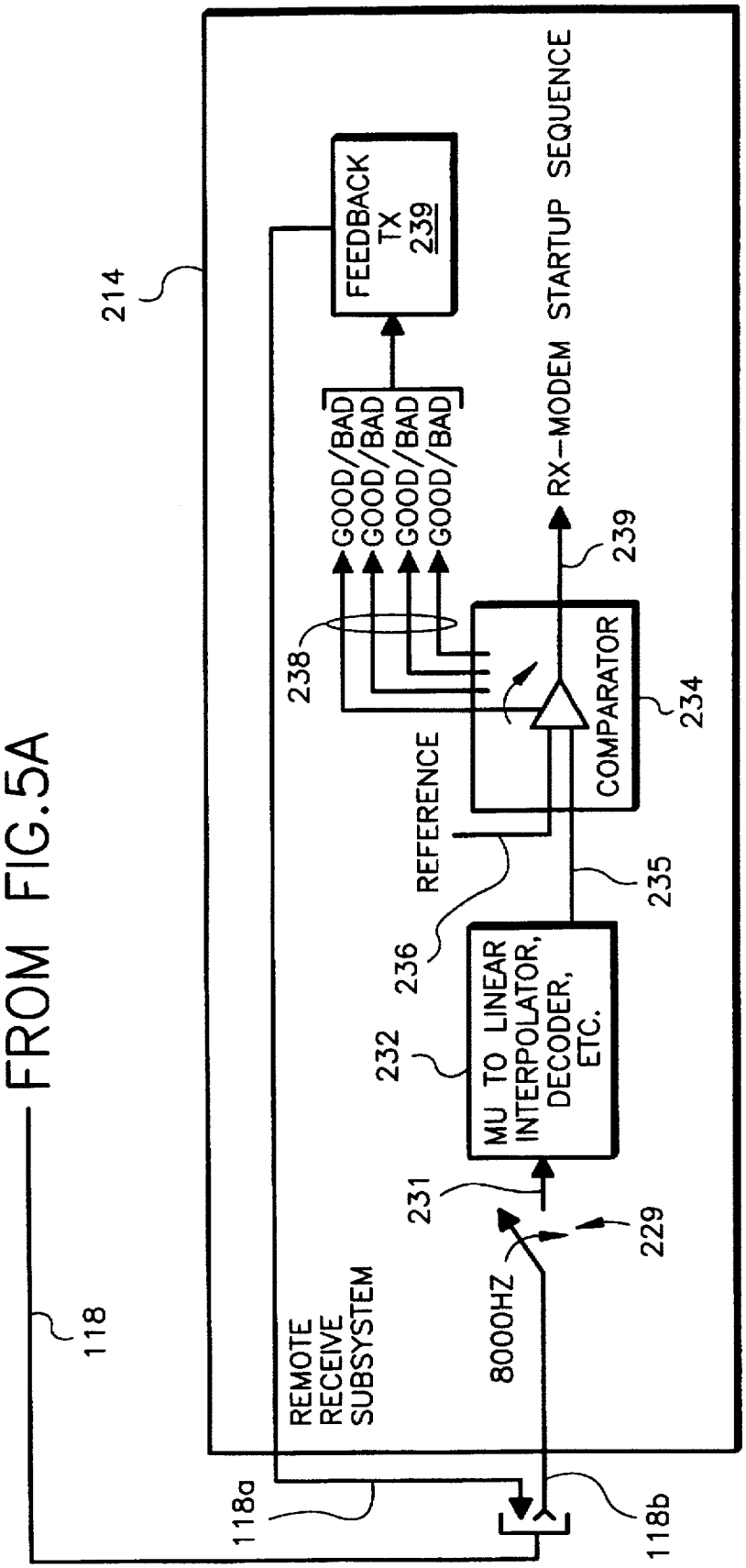

Based upon the frames set forth in Table A, the feedback system 210, 240 (FIGS. 5 and will determine that the digital network 113 employs 3 rob bits in the form of a mark in the frames 1, 3, and 4.

Accordingly, the mark ring counter 146 is loaded with the mark initialization word 153b (FIG. 3) of "101100", each bit of which corresponds to a frame, and the space ring counter 156 is loaded with a space initialization word 153a (FIG. 3) of "000000", each bit of which corresponds to a frame. The words 153a, 153b are shifted one bit to the left in each counter 156, 146 during each frame, and the most significant bit (MSB) in each counter 156, 146 is analyzed by being passed to the respective adders 131a, 131b, as indicated by corresponding reference arrows 151, 161 (FIG. 3).

When the MSB in mark ring counter 146 is a logical "1", then the adder 131b will add −0.5 LSB to the respective frame, and in converse, when the MSB in the mark ring counter 146 is a logical "0", then the adder 131b will add nothing to the respective frame. Similarly, when the MSB in the space ring counter 156 is a logical "1", then the adder 131a will add +0.5 LSB to the respective frame, and in converse, when the MSB in the mark ring counter 146 is a logical "0", then the adder 131b will add nothing to the respective frame.

As is apparent from the examples of the bit patterns, the mark ring counter 146 will cause −0.5 LSB to be added to select frames, while the space ring counter 156 will cause no quantities to be added to any of the frames. Table B set forth hereafter illustrates the shifting of the word in the mark ring counter 146 and the implementation of compensation during RBS frames.

TABLE B

| FRAME # | DATA LSB | MARK RING COUNTER VALUE | COMPENSATION |
|---------|----------|------------------------|--------------|
| 1 | 0110000 1 | 101100 | yes |
| 2 | 0010111 0 | 011001 | no |
| 3 | 1111001 1 | 110010 | yes |
| 4 | 1010010 1 | 100101 | yes |
| 5 | 0000100 0 | 001011 | no |
| 6 | 0101011 1 | 010110 | no |
| 1 | 1111000 1 | 101100 | yes |
| 2 | 1010000 0 | 011001 | no |

As illustrated in Table B, with the specific counter bit patterns set forth previously in this example, every first, third, and fourth frame will be compensated by addition of −0.5 LSB, while the remainder of the frames are left unchanged, regardless of the current state of the LSB in that frame.

B. Coder/Decoder (Codec)

The codec 106 (FIG. 1) can also be equipped with a rob bit compensation system 130 in connection with one or both of its data streams. The rob bit compensation system 130 may be associated with the communications connection 114b leading from the digital network 113. Copending commonly assigned application entitled "Rob Bit Compensation System Associated With A Receiver Or Codec," filed the same day as the present application by the inventors herein and assigned serial no. (to be assigned) describes a codec having a rob bit compensation system 130 associated with the latter communications path. The rob bit compensation system 130 may also be associated with the communications connection 114a leading to the digital network 113, as is described hereafter. However, this implementation generally requires some type of feedback in order to know which frames are LSB frames.

Figure 4:
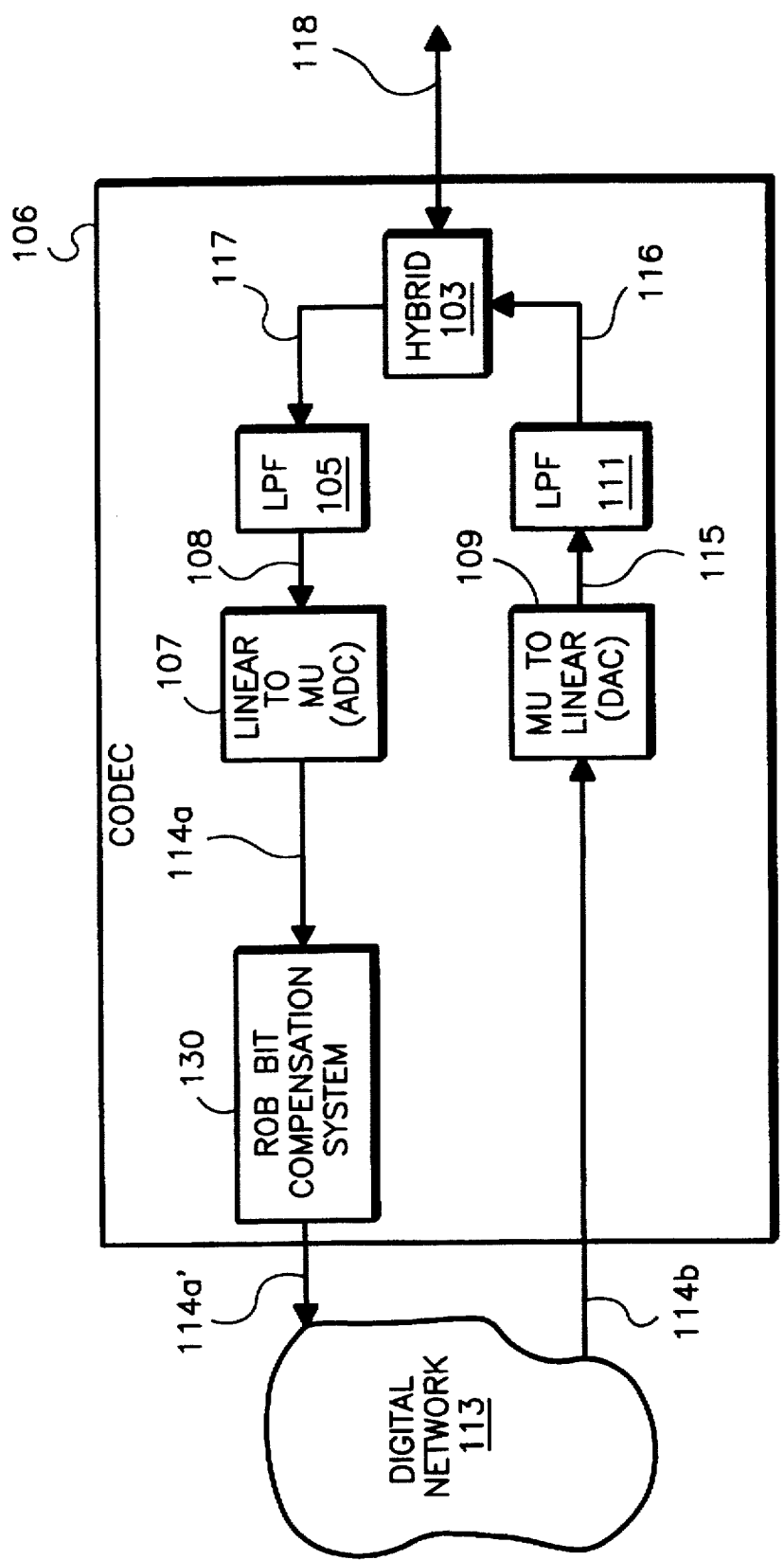
FIG. 4 is an electronic block diagram of a possible implementation of a codec that employs the rob bit compensation system of FIG. 3.

With reference to FIG. 4, in regard to the communications connection 114a, the rob bit compensation system 130 is configured to receive the stream of mu-law nonlinear digital code words as indicated by reference arrow 114a from the linear-to-mu ADC 107 in the codec 106. Further, the system 130 is adapted to combine compensation, when appropriate, to produce a compensated stream 114a' of mu-law nonlinear digital code words for the digital network 113.

In the preferred embodiment, the rob bit compensation system 130 causes one-half of an LSB to be added to each mu-law nonlinear digital code word 114b corresponding with the RBS frame when the RBS LSB is a space (logical 0), or alternatively, one-half of an LSB to be subtracted from each mu-law nonlinear digital code word 114b corresponding with the RBS frame when the RBS LSB is a mark (logical 1).

Note that the elements of the codec 106 of FIG. 4 can be implemented in software, firmware, hardware, or a combination thereof. In the preferred embodiment, the elements 103, 105, 107, 109, and 111 are implemented in hardware, while the rob bit compensation system 130 is implemented in hardware or software/firmware in the ADC 107. In embodiments where the system 130 is implemented in software/firmware, it may be stored and transported on any computer-readable medium for use by or in connection with a computer-related system or method.

C. First Embodiment of a Feedback System

The fast embodiment is a cooperative feedback system and method, wherein elements of a transmitter cooperate with elements in a receiver in order to identify distorted digital data frames. The methodology of the cooperative feedback system can be broadly summarized as follows: combining at a transmitter (e.g., analog modem, digital modem, codec, etc.) different compensations with respective frames of digital data to produce modified digital data frames; communicating the modified digital data frames from the transmitter to a receiver (e.g., analog modem, digital modem, etc.); determining at the receiver if the accuracy of each of the digital data frames is increased based upon a corresponding compensation; transmitting from the receiver to the transmitter a quality feedback signal for each of the modified digital data frames indicative of whether the corresponding compensation has increased the accuracy; receiving the quality feedback signals at the transmitter; and selecting at the transmitter one of the compensations that yields a highest accuracy based upon the quality feedback signals.

For purposes of clarity and simplicity and in no way limited thereto, the cooperative feedback system will be discussed hereafter in connection with the rob bit compensation system 130. In the context of RBS, the cooperative feedback system enables the rob bit compensation system 130 to improve the accuracy of digital signals transmitted to the digital network 113 by providing the rob bit compensation system 130 with information regarding which frames (RBS frames) have a bit robbed therefrom.

FIG. 5 is an electronic block diagram of the cooperative feedback system, generally denoted by reference numeral 210, that can be utilized to provide feedback regarding RBS frames to the compensation control 133 (FIG. 3). In this example, at the start of a call, a compensation is inserted and then the response of the remote modem (e.g., modem 102 in FIG. 1) is monitored for the existence of performance improvement. If performance improves, then the compensated frame is considered an RBS frame. The foregoing process is continued at the start of the call for a predetermined number n of frames.

The feedback system 210 includes elements in the local transmit subsystem 181 associated with, for example, the modem 101 (FIG. 1), cooperating with elements in the remote receive subsystem 214 associated with, for example, the analog modem 102 (FIG. 1).

The elements situated at the local transmit subsystem 181 include the following. An OR logic gate 205 is configured to generate a selector control signal(s) 206, based upon receipt of an initialization signal(s) 207 from the modem controller or of a feedback signal(s) 112a from the remote receive subsystem 214. The initialization signal 207 is produced initially in order to commence the cooperative feedback system 210 to test compensation(s). In general, the signal 206 includes information regarding the time when a compensation system 130 should be activated and its compensation setting, and the signal 112a includes information regarding which of the compensations resulted in better performance.

A compensation selector 204 is configured to receive the selector control signal 206. When the compensation selector 204 is advised to test compensations, the compensation selector 204 switches to different compensations at predetermined time intervals. In the preferred embodiment, the various compensations are implemented and tested by reconfiguring the mark and space ring counters 146, 156 (FIG. 3) during each test trial, as conceptually illustrated in FIG. 5 via select and initialization signals 208, 153a, 153b leading to each of n different compensations and OR logic 212 connected to each of the compensations as indicated by reference arrows 211.

Note that the n compensations can be any type, but in the context of correcting RBS, each compensation is generally the addition or subtraction of 0.5 LSB to a frame.

During each test trial, the selected compensation 213 is passed onto the addition mechanism 131 (adders 131a, 131b in FIG. 3), which combines the compensation 213 with a startup sequence 218 associated with the local transmit subsystem 181. In the local transmit subsystem 181, either the transmit data 183 (also, FIG. 3) or the aforementioned startup sequence 218 is communicated to the addition mechanism 131, as indicated via OR logic 217. An example of a startup sequence would be the probe sequence described in the V.34 specification. The V.34 probe sequence could be partitioned into 24 consecutive segments. The V.34 probe sequence lasts approximately 300 milliseconds. With this implementation, the compensation 213 would be changed every 13 milliseconds.

During each time interval, the addition mechanism 131 provides a compensated frame 225 to the linear-to-mu converter 197. Further, the converter 197 outputs the 8-bit mu-law code words 198 to the switch 203, which in turn communicates them to digital network 113 via connection 112b at 8000 hz.

The remote receive subsystem 214 receives the mu-law code words corresponding to the compensated frames in succession from the connection 118 via a switch 229 at 8000 hz. The signals 231 from the switch 229 are passed to standard signal processing components, including a decoder, etc., as denoted collectively by block 232. The decoder generally demodulates and processes the incoming linear code words in accordance with any suitable format, such as the V.34 protocol. A comparator 234 receives the decoded bit stream 235 from the block 232 of components and compares it with a reference 236. In the preferred embodiment, the reference 236 is essentially a bit stream that is free of errors and that should have been received by the remote receive subsystem 214. However, in other possible embodiments, the signal 235 could be a signal-to-noise level, in which case, the reference 236 would be a signal-to-noise threshold level.

A good/bad indicator 238, such as a bit, to indicate whether or not the accuracy of signal 235 has improved is generated by the comparator 234 for each frame and forwarded to a feedback transmitter 239, which performs any suitable processing of the good/bad indicators 238. The collection of good/bad indicators 238 or a derivative signal thereof is returned to the compensation selector 204 of the local transmit subsystem 181 via the feedback transmitter 239 situated at the remote receive subsystem 214 and the connection 118. The indicators 238 may be forwarded together in a single segment, independently, or in groups back to the transmit subsystem, whichever is appropriate.

In the preferred embodiment, the remote receive subsystem 214 analyzes each segment independently, reporting back to the local transmit subsystem 181 through the MP Type 1 sequence, which is a portion of the mining sequence specified by the V.34 recommendation. Using currently undefined or reserved bits in the MP sequence, an indication as to which frames were improved is relayed back to the local transmit subsystem 181.

With the good/bad indicators 238 from the receive subsystem 214, the compensation selector 204 of the transmit subsystem 181 can apply the best overall compensation 214 to allow high speed operation. Multiple rob bits may be compensated.

Additionally, during V.34 renegotiations in fast retrains, information or remote performance quality information can be fed back to the transmitter 212. Examples of information fed back could be, but not limited to, overall signal quality, signal-to-noise ratio, receive signal level, etc.

In response to the good/bad indicators 238, the compensation selector 204 determines which frames are RBS frames. Based upon this determination, the compensation selector 204 programs the mark and space ring counters 146, 156 (FIG. 3) to implement a particular compensation.

D. Second Embodiment of a Feedback System

The second embodiment is a noncooperative feedback system and method, wherein elements of a transmitter do not cooperate with elements in a receiver in order to identify distorted digital data frames. The methodology of the noncooperative feedback system can be broadly summarized as follows: combining at a transmitter (e.g., analog modem, digital modem, codec, etc.) a plurality of compensations to segments of digital data respectively to produce modified digital data segments; communicating the modified digital data segments from the transmitter to a receiver (e.g., analog modem, digital modem, etc.); receiving retransmissions requests at the transmitter from the receiver; determining which of the compensations yields a lowest error based upon the retransmission requests; and implementing the lowest error compensation at the transmitter.

For purposes of city and simplicity and in no way limited thereto, the noncooperative feedback system and method of the invention will be discussed hereafter in connection with the rob bit compensation system 130. In the context of RBS, the noncooperative feedback system enables the rob bit compensation system 130 to improve the accuracy of digital signals transmitted to a digital network 113 by providing the rob bit compensation system 130 with information regarding which frames (RBS frames) have a bit robbed therefrom.

Figure 6:
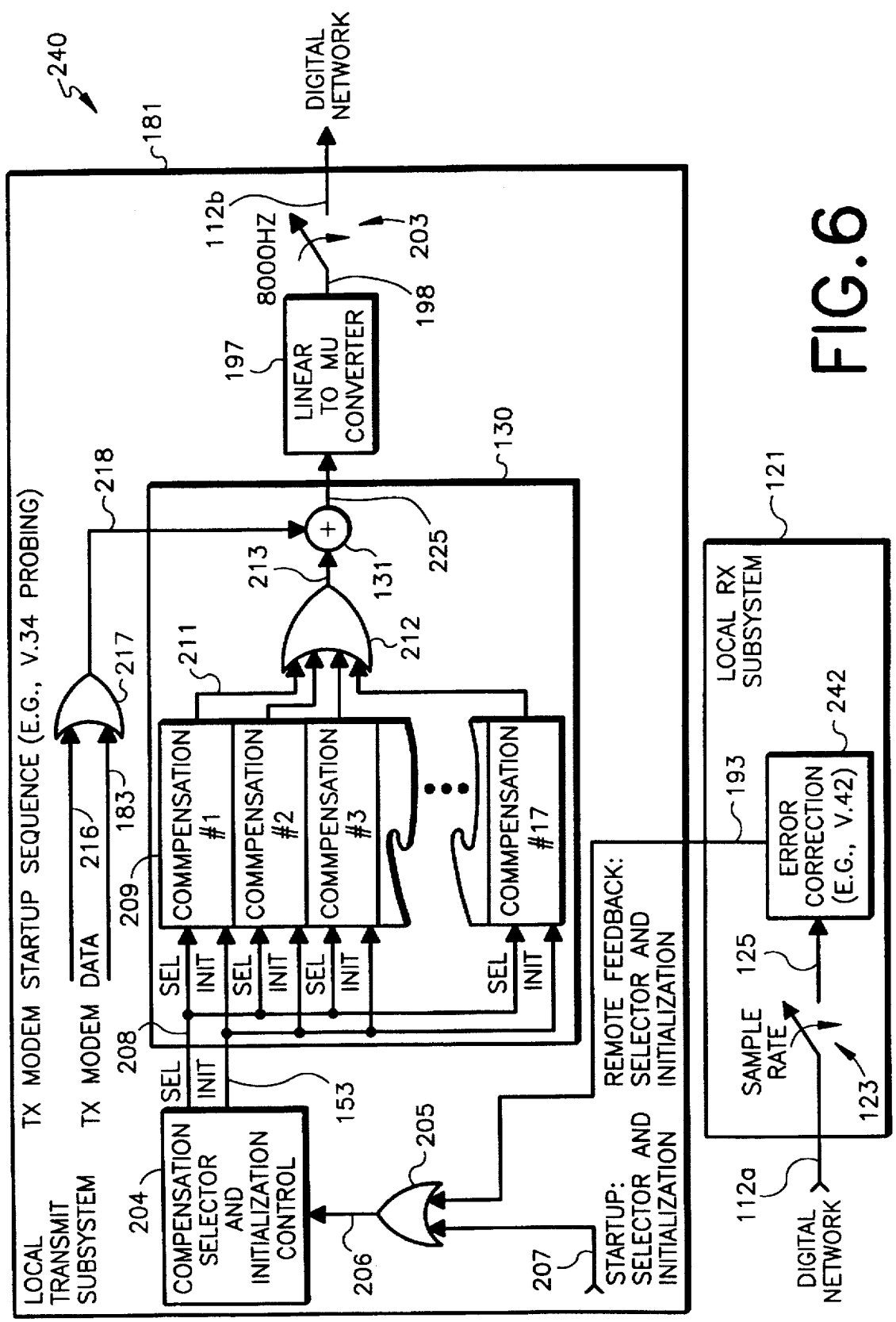
FIG. 6 is electronic block diagram of a possible second embodiment of a feedback system (noncooperative) associated with the compensation selector of FIG. 5.

FIGS. 6 is electronic block diagram of the noncooperative feedback system, generally denoted by reference numeral 240. In this example of an implementation, a method for detecting RBS frames involves monitoring requests for block retransmission from the remote modem 102 (FIG. 1). This method can be used, for example, with any modem that uses standard V.42 error correction. An advantage of this method is that it does not require modification of any existing modem and does not require cooperative effort between the transmitting and receiving modems.

More specifically, referring to FIG. 6, the noncooperative feedback system 240 includes elements in the local transmit subsystem 181 corresponding with those shown in FIG. 3 and described previously. For purposes of simplicity, the discussion relating to the components of the local transmit subsystem 181 of FIG. 3 is incorporated herein by reference.

In the noncooperative feedback system 240 of FIG. 6, the local transmit subsystem 181 compensates the RBS frames one at a time with the compensations 209. After each compensation 209 in a particular frame, the transmit subsystem 181 will dwell for a predetermined time period while the local receive subsystem 121 monitors the channel 112a for retransmission requests. The receive subsystem 121 can be equipped with any suitable error correction mechanism 242 for monitoring retransmission requests. In the preferred embodiment, the error correction mechanism 242 is a standard V.42 error correction mechanism set forth in the industry standard V.42 specification. For RBS, compensating the correct frame will result in higher data rates and decreased retransmission requests. Compensating on the wrong frame will result in lower data rates and increased retransmission requests. Based upon the number of retransmission requests, the error correction mechanism 242 determines which frames are RBS frames and generates the feedback control signal 193, which is communicated to the compensation selector 204.

Based upon the feedback 193 from the error correction mechanism 242, the compensation selector 204 can select and implement a compensation(s), if appropriate, via programming the mark and space ring counters 146, 156 (FIG. 3).

An advantage of the noncooperative feedback system 240 is that no loss of data synchronization ever occurs. The system 240 also works with any vender's product that supports automatic rate control, V.42 his error correction, or other error correcting protocols.

D. Software

The rob bit compensation system 130 of the invention can be implemented in software. One possible implementation of the software version for the transmit subsystem 181 is set forth hereafter.

```
lin2mu:
        a0=a0>>1
        a0=a0>>1            /* right justify 14 bits */
        a0=rnd(a0)          /* round 14 bit value */
        a0=a0<<1            /* left justify 14 bits */
        a0=a0<<1            /* a0h = Sddd dddd dddd dd00 */
        y=0x8000            /* mask for sign bit */
                            /* y = 1000 0000 0000 0000 */
        a1=a0&y             /* a1h = S000 0000 0000 0000 */
        if ne a0=-a0        /* if negative take 2s complement */
                            /* input data in-place in a0h */
/* Begin Digital Loss Compensation */
        r0=d_loss1          /* Get loss scaler table pointer */
        pt=*r0
        y=a0 x=*p++
d_lossin:
        p=x*y *r3=a1
        a1=p
        y=132               /* y =0000 0000 1000 0100 */
                            /* bias value (33) shifted left by 2 */
                            /* bits to compensate for the 14 bit */
                            /* input data being left justified */
        a1=a1+y             /* a0h += 0000 0000 1000 0100 */
                            /* *linmu = S000 0000 0000 0000 */
        c1=-8               /* initialize counter 1 for finding */
                            /* the segment */
do 8    {                   /* determine the segment number */
        ifc p1 a1=a1<<1     /* (exponent) and the */
        }                   /* compressed code word into place */
                            /* a0h =1ccc cxxx xxxx xxxx */
        a1=a1>>8
        x=a1                /* Temp store of a1 data */
        a1=c2               /* Move c2 to c0 */
        c0=a1
        c1=-1               /* Set c1 for no RBS */
        r0=d_loss2          /* Read RBS indentifier bits */
        a1=*r0
        a1=a1<<1            /* Shift next bit to msb */
        *r0=a1              /* Save RBS identifier */
        a1=x                /* Restore a1 */
        if p1 goto lin2mu05 /* No changes if msb=0 */
        a1=*r0
        y=0x200             /* RBS identifier bit */
        a1 =a1|y            /* Reset RBS identifier */
        *r0=a1              /* Save RBS identifier */
        a1=x                /* Restore a1 */
        y=4
        a1=a1+y
        y=0x80              /* Test for negative result */
        a1&y
        if ne goto lin2mu05 /* Jump if no RBS needed */
        c1=0                /* Set c0 for RBS */
lin2mu05:
        y=0x78
        a1=a1&y
        y=132               /* put 1s before and after the */
        a1=a1+y             /* compressed code word */
                            /* a1h = 0000 0000 001c ccc1 */
        if c1ge a1=a1<<1    /* Shift if RBS */
do 7    {                   /* the formatted compressed */
        if c0lt a1=a1<<1    /* code word into place, i.e. */
        }                   /* apply exponent (segment) */
                            /* a1h = 00 0000 001c ccc1 seg = 0 */
                            /* a1h = 00 0000 01cc cc10 seg = 1 */
                            /* a1h = 00 0000 1ccc c100 seg = 2 */
                            /* a1h = 00 0001 cccc 1000 seg = 3 */
                            /* a1h = 00 001c ccc1 0000 seg = 4 */
                            /* a1h = 00 01cc cc10 0000 seg = 5 */
                            /* a1h = 00 1ccc c100 0000 seg = 6 */
                            /* a1h = 01 cccc 1000 0000 seg = 7 */
        a1=a1-y             /* a1h -= 0x21 subtract bias (33) */
        y=a1 x=*pt++
        p=x*y
        a0=p
/* End Digital Loss Compensation */
/* End */
        y=132               /* y = 0000 0000 1000 0100 */
                            /* bias value (33) shifted left by 2 */
                            /* bits to compensate for the 14 bit */
                            /* input data being left justified */
        a0=a0+y             /* a0h += 0000 0000 1000 0100 */
                            /* *linmu = S000 0000 0000 0000 */
        c1 =-8              /* initialize counter 1 for finding */
                            /* the segment */
do 8    {                   /* determine the segment number */
        ifc p1 a0=a0 <<1    /* (exponent) and the */
        }                   /* compressed code word into place */
                            /* a0h = 1ccc cxxx xxxx xxxx */
        a0=a0>>4            /* the compressed code word */
        a0=a0<<1            /* into place */
                            /* a0h = 1111 cccc xxxx xxxx */
        a1=c2               /* c2 = negative segment number */
        a1=-a1              /* a1h = segment number */
                            /* a1h = 0000 0000 0000 0eee */
        a1=a1<<4            /* segment number into place */
        a1=a1<<8            /* a1h = 0eee 0000 0000 0000 */
        y=0x0f00            /* mask for compressed code word */
                            /* y = 0000 1111 0000 0000 */
        a0=a0&y             /* a0h = 0000 cccc 0000 0000 */
        y=a1                /* y = 0eee 0000 0000 0000 */
        a0=a0+y             y=*r3 /* add segment number to a0h */
                            /* a0h = 0eee cccc 0000 0000 */
                            /* y = S000 0000 0000 0000 */
        a0=a0+y             /* add sign bit to a0h */
                            /* a0h = Seee cccc 0000 0000 */
        a0=a0>>8            /* to low byte of a0h */
                            /* a0h = xxxx xxxx Seee cccc */
        y=0x00ff            /* mask for 8 bit Mulaw value */
        a0=a0&y             /* mask 8-bits to insure removal of */
                            /* sign extension */
                            /* a0h = 0000 0000 Seee cccc */
        a0=a0^y             /* invert bits to provide an inverted*/
                            /* Mulaw value in low byte of a0h */
        return
d_losstbl:
int 1.0, 1.0, 0.5, 0x7fff, 0.7071, 1.4142
END OF CODE
```

Many variations and modifications may be made to the preferred embodiments of the invention. All such modifications and variations are intended to be included herein within the scope of the present invention, as is defined by the following claims.

In the claims set forth hereinafter, the structures, materials, acts, and equivalents of all "means" elements and "logic" elements are intended to include any structures, materials, or acts for performing the functions specified in connection with said elements.

Wherefore, the following is claimed:

1. A computer readable medium having a program for improving accuracy of a digital signal received from a digital network that periodically robs a bit, the program comprising:
    means for receiving a digital data;
    means for detecting a frame in said digital data have rob bit;
    means for modifying said frame so that error associated with said frame resulting from said rob bit is reduced; and
    means for transmitting said modified frame to a digital network.

2. The medium of claim 1, wherein said program further comprises a means for receiving said digital data from an analog connection.

3. The method of claim 2, further comprising the steps of:
    detecting when a least significant bit of a particular frame of said digital data consistently exhibits a certain logic state; and
    combining a quantity with said digital data corresponding with said particular frame when said least significant bit of said particular frame consistently exhibits said certain logic state.

4. The method of claim 3, wherein said certain logic state is a mark.

5. The method of claim 3, wherein said certain logic state is a space.

6. The method of claim 3, further comprising the steps of:
evaluating said least significant bit to detect when said bit exhibits a mark; and
evaluating said least significant bit to detect when said bit exhibits a space.

7. The method of claim 2, wherein said modifying step comprises the step of subtracting one half of a least significant bit from said frame.

8. The method of claim 2, wherein said modifying step comprises the step of adding one half of at least significant bit from said frame.

9. The method of claim 2, further comprising the step of modifying every nth frame of said digital data, where n is any integer number greater than zero.

10. The method of claim 2, further comprising the step of modifying every twenty fourth frame of said digital data.

11. The method of claim 2, further comprising the step of, after said modifying step, transmitting said frame of said digital data to an analog connection.

12. A system for improving accuracy of a digital signal transmitted to a digital network that periodically robs a bit, comprising:
means for receiving digital data;
means for detecting a frame in said digital data having rob bit;
means for modifying said frame so that error associated with said frame resulting from said rob bit is reduced; and
means for transmitting said modified frame to a digital network.

13. The system of claim 12, wherein said means for modifying comprises a means for subtracting one half of a least significant bit to said frame.

14. The system of claim 12, wherein said means for modifying comprises a means for adding one half of a least significant bit to said frame.

15. The system of claim 12, wherein further comprising:
a feedback mechanism configured to produce a feedback control signal;
logic configured to receive said feedback control signal and a ring counter signal, said logic configured to produce a control signal based upon said digital data and said ring counter signal;
a ring counter configured to receive said least significant bit of each said frame, said ring counter configured to generate said ring counter signal; and
an adder configured to mathematically combine a quantity with said digital data based upon said control signal.

16. The system of claim 12, wherein further comprising:
a feedback mechanism configured to produce a feedback control signal;
logic configured to receive feedback control signal, a mark ring counter signal, and a space ring counter signal, said logic configured to produce a control signal based upon said digital data and said mark and space ring counter signals;
a mark ring counter configured to receive said feedback control signal, said mark ring counter configured to generate said mark ring counter signal; and
a space ring counter configured to receive said feedback control signal, said space ring counter configured to generate said space ring counter signal; and
an adder configured to mathematically combine a quantity with said digital data based upon said control signal.

17. The system of claim 12, wherein said frame is every nth frame of said digital data, where n is any integer number greater than zero.

18. The system of claim 12, wherein said frame is every twenty fourth frame of said digital data.

19. The system of claim 12, further comprising a means for receiving said frame from an analog connection.

20. The system of claim 12, wherein said means for receiving, said means for detecting, said means for modifying, and said means for transmitting are all implemented in software.

21. The system of claim 12, wherein said means for receiving, said means for detecting, said means for modifying, and said means for transmitting are all implemented in a digital signal processor.

22. The system of claim 12, further comprising a linear-to-mu converter connected to said means for modifying and configured to convert said digital data to mu-law digital data.

23. A method for improving accuracy of a digital signal received from a digital network that periodically robs a bit, comprising the steps of:
receiving digital data;
detecting a frame in said digital data having rob bit;
modifying said frame so that error associated with said frame resulting from said rob bit is reduced; and
transmitting said modified frame to said digital network.

* * * * *

UNITED STATES PATENT AND TRADEMARK OFFICE
CERTIFICATE OF CORRECTION

PATENT NO. : 5,729,226
DATED : March 17, 1998
INVENTOR(S) : William Lewis BETTS and Keith Alan SOUNDERS It is certified that error appears in the above-indentified patent and that said Letters Patent is hereby corrected as shown below:

Col. 4, line 53, after "System" and before "Associated" insert -- and Method --.
Col. 4, line 56, replace "(to be assigned)" with -- 08/697,373 --.
Col. 8, line 40, replace "mark" with -- space -- and replace "146" with -- 156 --.
Col. 8, line 41, replace "131b" with -- 131a --.
Col. 8, line 58, replace "0101011 1" with -- 0101011 0 --.
Col. 9, line 8, after "System" and before "Associated" insert -- and Method --.
Col. 9, line 10, replace "(to be assigned)" with -- 08/697,373 --.
Col. 14, line 49, replace "have" with -- having a --.
Col. 14, line 55, replace "a" with -- said --.
Col. 14, line 60, replace "2" with -- 23 --.
Col. 15, line 1, replace "3" with -- 23 --.
Col. 15, line 3, replace "3" with -- 23 --.
Col. 15, line 5, replace "3" with -- 23 --.
Col. 15, line 10, replace "2" with -- 23 --.
Col. 15, line 13, replace "2" with -- 23 --.
Col. 15, line 16, replace "2" with -- 23 --.
Col. 15, line 19, replace "2" with -- 23 --.
Col. 15, line 21, replace "2" with -- 23 --.
Col. 15, line 28, after "having" and before "rob" insert -- a --.

UNITED STATES PATENT AND TRADEMARK OFFICE
CERTIFICATE OF CORRECTION

PATENT NO. : 5,729,226
DATED : March 17, 1998
INVENTOR(S) : William Lewis BETTS and Keith Alan SOUNDERS It is certified that error appears in the above-indentified patent and that said Letters Patent is hereby corrected as shown below:

Col. 15, line 34, replace "a" with -- said --.
Col. 15, line 42, delete "wherein".
Col. 16, line 6, delete "wherein".
Col. 16, line 43, after "having" and before "rob" insert -- a --.

Signed and Sealed this

Twenty-fifth Day of August, 1998

Attest:

Attesting Officer

BRUCE LEHMAN

Commissioner of Patents and Trademarks